United States Patent
Kim et al.

(10) Patent No.: US 10,025,149 B2
(45) Date of Patent: *Jul. 17, 2018

(54) THIN FILM TRANSISTOR ARRAY PANEL AND DISPLAY DEVICE INCLUDING THE SAME

(71) Applicant: SAMSUNG DISPLAY CO., LTD, Yongin-si, Gyeonggi-Do (KR)

(72) Inventors: Dong-Gyu Kim, Yongin-si (KR); Seung-Hwan Moon, Yongin-si (KR); Yong-Soon Lee, Cheonan-si (KR); Nam-Soo Kang, Ansan-si (KR); Haeng-Won Park, Seongnam-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/877,078

(22) Filed: Jan. 22, 2018

(65) Prior Publication Data
US 2018/0143478 A1    May 24, 2018

Related U.S. Application Data

(63) Continuation of application No. 15/095,473, filed on Apr. 11, 2016, now Pat. No. 9,874,794, which is a (Continued)

(30) Foreign Application Priority Data

Jul. 27, 2004 (KR) .................. 10-2004-0058708
Sep. 24, 2004 (KR) .................. 10-2004-0077500

(51) Int. Cl.
*H01L 27/14* (2006.01)
*H01L 29/04* (2006.01)
(Continued)

(52) U.S. Cl.
CPC ........ *G02F 1/13454* (2013.01); *G02F 1/1339* (2013.01); *G02F 1/136286* (2013.01);
(Continued)

(58) Field of Classification Search
CPC .. G02F 1/1339; G02F 1/1345; G02F 1/13454; G02F 1/136286;
(Continued)

(56) References Cited

U.S. PATENT DOCUMENTS 5,654,781 A    8/1997    Izumi
5,723,878 A    3/1998    Yanai
(Continued)

FOREIGN PATENT DOCUMENTS

CN    1369871    9/2002
CN    1399161    2/2003
(Continued)

*Primary Examiner* — Insa Sadio
(74) *Attorney, Agent, or Firm* — Innovation Counsel LLP

(57) ABSTRACT

Gate-driving circuitry of a thin film transistor array panel is formed on the same plane as a display area of the transistor array panel. The gate-driving circuitry includes driving circuitry and signal lines having apertures. Thus, a sufficient amount of light, even though illuminated from the thin film transistor array panel side, can reach a photosetting sealant overlapping at least in part the gate-driving circuitry. The thin film transistor array panel and the counter panel are put together air-tight and moisture-tight. Consequently, the gate-driving circuitry can avoid corrosion by moisture introduced from outside. Gate-driving circuitry malfunctions can also be reduced.

20 Claims, 11 Drawing Sheets

Related U.S. Application Data continuation of application No. 12/707,639, filed on Feb. 17, 2010, now Pat. No. 9,310,657, which is a continuation of application No. 11/111,093, filed on Apr. 20, 2005, now Pat. No. 7,692,617.

(51) Int. Cl.

| | | |
|---|---|---|
| *H01L 29/15* | (2006.01) | |
| *H01L 31/036* | (2006.01) | |
| *G02F 1/1345* | (2006.01) | |
| *H01L 27/12* | (2006.01) | |
| *G02F 1/1339* | (2006.01) | |
| *H01L 29/786* | (2006.01) | |
| *G02F 1/1362* | (2006.01) | |

(52) U.S. Cl.
CPC ........ *H01L 27/124* (2013.01); *H01L 27/1222* (2013.01); *H01L 27/1255* (2013.01); *H01L 29/78669* (2013.01); *H01L 29/78678* (2013.01); *G02F 1/1345* (2013.01); *G02F 2001/13629* (2013.01)

(58) Field of Classification Search
CPC ....... G02F 2001/13629; H01L 27/1222; H01L 27/124; H01L 27/1255; H01L 29/78669; H01L 29/78678
See application file for complete search history.

(56) References Cited

U.S. PATENT DOCUMENTS

| | | | |
|---|---|---|---|
| 5,744,820 A | 4/1998 | Matsushima et al. | |
| 6,014,193 A | 1/2000 | Taira et al. | |
| 6,124,154 A | 9/2000 | Miyasaka | |
| 6,163,358 A | 12/2000 | Nonaka et al. | |
| 6,249,326 B1 | 6/2001 | Hebiguchi | |
| 6,337,726 B1 | 1/2002 | Kawano et al. | |
| 6,365,936 B1 | 4/2002 | Shimabukuro et al. | |
| 6,429,057 B1 | 8/2002 | Hong et al. | |
| 6,521,013 B1 | 2/2003 | Naito et al. | |
| 6,590,553 B1 | 7/2003 | Kimura et al. | |
| 6,896,940 B2 | 5/2005 | Sato et al. | |
| 6,900,853 B2 | 5/2005 | Watanabe et al. | |
| 6,906,769 B2 | 6/2005 | Sato | |
| 6,992,718 B1 | 1/2006 | Takahara | |
| 7,064,350 B2 | 6/2006 | Park | |
| 7,133,093 B2 | 7/2006 | Ochiai et al. | |
| 7,271,787 B2 | 9/2007 | Kim et al. | |
| 7,271,855 B2 | 9/2007 | Cho et al. | |
| 7,291,860 B2 | 11/2007 | Jung et al. | |
| 7,362,304 B2 | 4/2008 | Takatori et al. | |
| 7,402,945 B2 | 7/2008 | Yamazaki et al. | |
| 2001/0015626 A1 | 8/2001 | Ozawa | |
| 2002/0067322 A1* | 6/2002 | Yanagawa | G02F 1/134363 345/87 |
| 2002/0075442 A1 | 6/2002 | Yanagawa et al. | |
| 2002/0127857 A1 | 9/2002 | Ohgami et al. | |
| 2002/0196393 A1 | 12/2002 | Tashiro et al. | |
| 2003/0071931 A1* | 4/2003 | Nakayoshi | G02F 1/136213 349/39 |
| 2003/0081164 A1 | 5/2003 | Sato et al. | |
| 2003/0094613 A1 | 5/2003 | Joo et al. | |
| 2003/0112383 A1 | 6/2003 | Kim | |
| 2003/0184693 A1 | 10/2003 | Kadotani et al. | |
| 2003/0193465 A1* | 10/2003 | Ohkawa | G09G 3/3688 345/100 |
| 2004/0056831 A1 | 3/2004 | Takatori et al. | |
| 2004/0085488 A1 | 5/2004 | Cho et al. | |
| 2004/0085506 A1 | 5/2004 | Yanagawa et al. | |
| 2004/0095541 A1 | 5/2004 | Takeichi et al. | |
| 2005/0024550 A1 | 2/2005 | Kim | |
| 2005/0052590 A1 | 3/2005 | Ochiai et al. | |
| 2005/0139821 A1 | 6/2005 | Park | |
| 2005/0237812 A1 | 10/2005 | Chang | |
| 2006/0164565 A1 | 7/2006 | Lee et al. | |
| 2007/0249105 A1 | 10/2007 | Kim | |
| 2007/0285612 A1 | 12/2007 | Cho et al. | |
| 2008/0225223 A1 | 9/2008 | Yanagawa et al. | |
| 2009/0179202 A1 | 7/2009 | Hong et al. | |

FOREIGN PATENT DOCUMENTS

| | | |
|---|---|---|
| CN | 1399161 A | 2/2003 |
| CN | 1410806 | 4/2003 |
| CN | 1503040 | 6/2004 |
| JP | 06-308473 | 11/1994 |
| JP | 08-213631 | 8/1996 |
| JP | 09-297319 | 11/1997 |
| JP | 11-052394 | 2/1999 |
| JP | 11-084427 | 3/1999 |
| JP | 2000-066240 | 3/2000 |
| JP | 2002-110343 | 4/2002 |
| JP | 2003-066485 | 3/2003 |
| JP | 2003-121867 | 4/2003 |
| JP | 2003-287774 | 10/2003 |
| KR | 10-0182247 | 12/1998 |
| KR | 10-0193140 | 2/1999 |
| KR | P1999-009765 | 2/1999 |
| KR | 10-0220550 | 6/1999 |
| KR | 10-2000-0051641 | 8/2000 |
| KR | 10-2003-0053179 | 6/2003 |
| TW | 543145 | 7/2003 |
| WO | 03/087921 | 10/2003 |

* cited by examiner

THIN FILM TRANSISTOR ARRAY PANEL AND DISPLAY DEVICE INCLUDING THE SAME

RELATED APPLICATIONS

This application is a continuation application of U.S. patent application Ser. No. 15/095,473, which was filed on Apr. 11, 2016, and is a continuation of U.S. Pat. No. 9,310,657, and is a continuation of U.S. Pat. No. 7,692,617, which claims the benefit and priority of Korean Patent Application Serial Nos. 10-2004-0058708 filed on Jul. 27, 2004 and 10-2004-0077500 filed on Sep. 24, 2004; the prior applications and patents are incorporated herein by reference.

TECHNICAL FIELD

The present invention relates to display device technology and, more particularly, to the design and the application of thin film transistor array panels and display devices including such thin film transistor array panels.

BACKGROUND

In general, a display device includes a display panel, gate-driving circuitry and data-driving circuitry. The display panel includes a thin film transistor array panel having gate lines, data lines, pixel electrodes and thin film transistors, an opposite panel having one or more common electrodes, and a liquid crystal layer provided between the two panels. The two panels are aligned and sealed by a sealant. The gate-driving circuitry and the data-driving circuitry are usually provided on a printed circuit board, or as integrated circuits connected to the display panel.

Recently, the gate-driving circuitry has been formed directly on the thin film transistor array panel in order to minimize device size and to increase efficiency. In such a structure, however, a parasitic capacitance is created between the gate-driving circuitry and the common electrode or electrodes on the opposite panel, which may cause the gate-driving circuitry to malfunction. Because the dielectric constant of the sealant is less than that of the liquid crystal molecules, it has been proposed to provide the sealant between the gate-driving circuitry and the opposite panel to reduce the parasitic capacitance.

As display devices become larger, the one-drop-filling (ODF) method is widely used with a photosetting sealant to provide the liquid crystal material between the two panels. The photosetting sealant, which holds the two panels, is hardened by exposure to light. The sealant is irradiated from the thin film transistor array panel side because an opaque layer is usually formed on the opposite panel facing the gate-driving circuitry. Irradiating from the thin film transistor array panel side, however, may lead to insufficient light to harden the sealant, especially when the width of a signal line, or a transistor, in the gate-driving circuitry, is larger than 100 μm. Consequently, the two panels may be susceptible to moisture entered through the insufficiently cured sealant, leading to corrosion in the gate-driving circuitry.

Accordingly, there is a need for a display device with gate driving circuitry that overcomes the disadvantages discussed above.

SUMMARY

Devices and methods disclosed herein are applicable to thin film transistor array panels and display devices. For example, in accordance with an embodiment of the present invention, a display device includes a thin film transistor array panel, a counter panel, a sealant, and a liquid crystal layer, which is provided in the space enclosed by the thin film transistor array panel, the counter panel and the sealant. Gate-driving circuitry which includes signal lines and driving circuitry, may be formed directly on the thin film transistor array panel and overlapped at least in part by the sealant and an opaque region of the counter panel.

An aperture may be formed on one or more signal lines, to allow light illuminating from the thin film transistor array panel side to easily pass, so as to facilitate the photoset sealant to harden. The signal lines may be formed as a ladder or a net-shaped structure. Such a ladder or net-shaped signal line may include vertical and horizontal branches between and connecting adjacent vertical branches. The width of a vertical or horizontal branch, or the width of the aperture, can be designed to facilitate light to pass through (e.g., about 20~30 μm, preferably about 25 μm). The signal line structure described above is especially suited for a signal line that is more than 100 μm wide.

The driving circuitry may include transistors connected in parallel and spaced apart to form one or more apertures among the transistors. The aperture width can be determined for easy light passage, e.g., about 20~100 μm wide.

With such apertures in the gate-driving circuitry, sufficient light is able to pass to harden the sealant, thereby holding the panels air-tight or moisture-tight. Consequently, the gate-driving circuitry can avoid corrosion by moisture from outside, and malfunctions in the gate-driving circuitry of the display device can be reduced.

The scope of the invention is defined by the claims. A more complete description of the embodiments of the present invention and their advantages are provided in the following.

Figure 1:
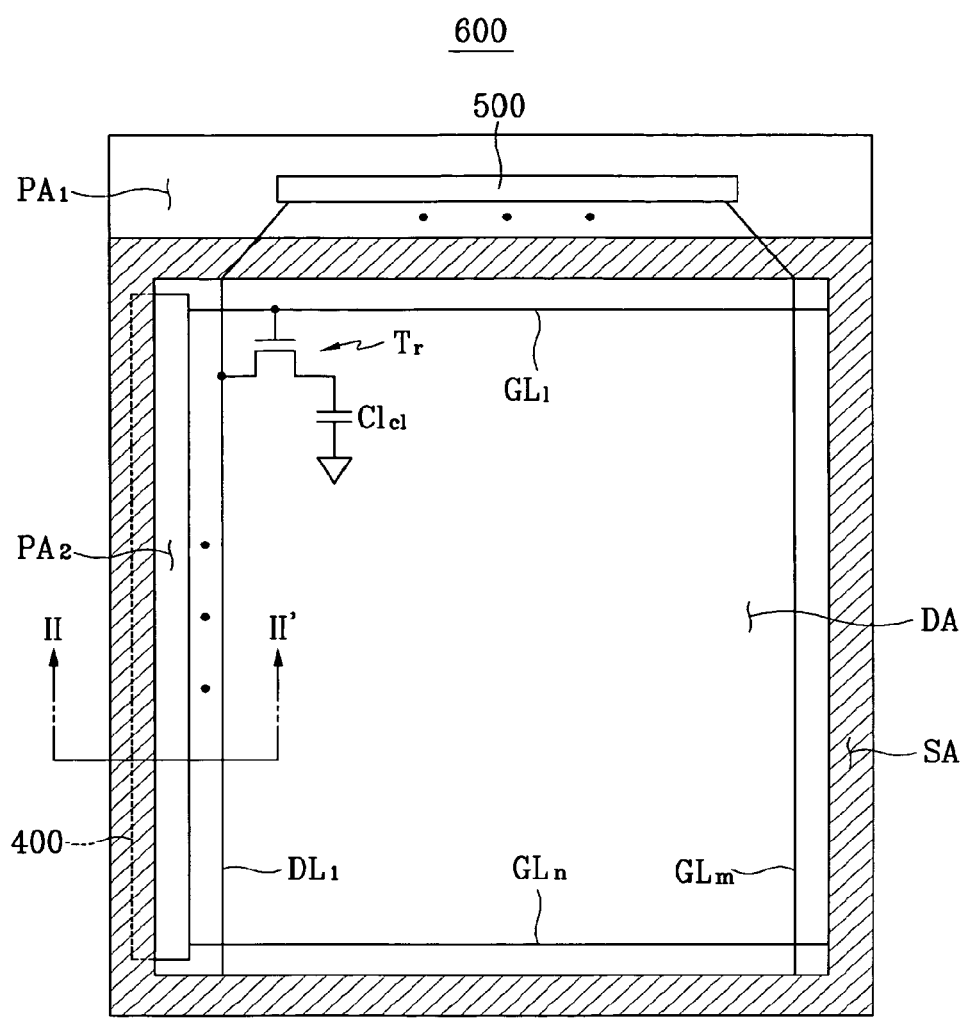
FIG. 1 is an exemplary layout view of a display device in accordance with an embodiment of the present invention.

Like reference numerals are used to identify like elements in the figures. Furthermore, the elements or layers may not be drawn to scale and may be magnified for clarity (e.g., when illustrating semiconductor layers), Also, the words "above" or "on" may be used, for example, to refer to a position of a layer, an area, or a plate relative to another referenced element, but such use is not intended to exclude an intermediate element disposed between the referenced element and the layer, area, or plate. However, the terms "directly above" or "directly on" are used to indicate that no intermediate element exists between the referenced element and the layer, area, or plate.

DETAILED DESCRIPTION

Figure 2:
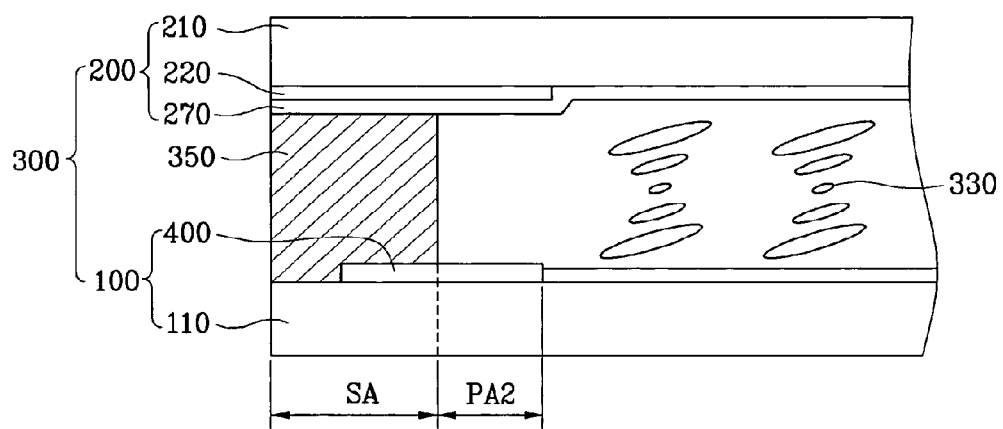
FIG. 2 is a cross-sectional view taken along the line II-IF of FIG. 1.

FIG. 1 is an exemplary layout view of a display device 600 in accordance with an embodiment of the present invention, and FIG. 2 is a cross-sectional view taken along the line II-II' of FIG. 1. As shown in FIGS. 1 and 2, display device 600 includes a display panel 300 displaying an image under control of the gate signals and data signals, which are provided by gate-driving circuitry 400 and data-driving circuitry 500, respectively. The display area DA and the gate-driving circuitry 400 may be formed on a single substrate, such as substrate 110 of FIG. 2.

The display panel 300 includes a thin film transistor array panel 100, a counter panel 200 opposite the thin film transistor array panel 100, a sealant 350 and a liquid crystal layer 330 provided in a space enclosed by the thin film transistor array panel 100, counter panel 200 and sealant 350.

The display panel 300 may be divided into a display area DA, a sealant area SA enclosing the display area DA, a first peripheral area PA1 outside the display area DA, and a second peripheral area PA2 overlapping at least in part the display area DA and the sealant area SA. The thin film transistor array panel 100 covers the display area DA, the sealant area SA, and the peripheral areas PA1 and PA2, while the counter panel 200 may not cover the first peripheral area PA1.

An equivalent circuit for the display panel 300 includes gate lines $GL_1 \sim GL_n$, data lines $DL_1 \sim DL_m$ and pixels electrically connected to them.

Gate lines $GL_1 \sim GL_n$ and data lines $DL_1 \sim DL_m$ are formed on a first substrate 110, insulated from and crossing each other on the display area DA, and extending to the second and first peripheral areas PA2 and PA1, respectively. Gate lines $GL_1 \sim GL_n$ and data lines $DL_1 \sim DL_m$ are connected to the gate-driving circuitry 400 and the data-driving circuitry 500, respectively.

Each pixel includes a liquid crystal capacitance $C_{lc}$, a thin film transistor Tr electrically connected to a corresponding gate line, and a corresponding data line.

The thin film transistor Tr is formed on the thin film transistor array panel 100, and includes a gate electrode connected to the gate line, a source electrode connected to the data line, and a drain electrode connected to the liquid crystal capacitance $C_{lc}$. The thin film transistor Tr also includes an amorphous silicon (a-Si) or a polycrystalline silicon.

The liquid crystal capacitance $C_{lc}$ includes a pixel electrode (not shown) formed on the thin film transistor array panel 100, a counter electrode 270 formed on a second substrate 210, and the liquid crystal layer 330 disposed between the pixel electrode and the counter electrode 270. The pixel electrode is electrically connected to the thin film transistor Tr, and the counter electrode 270 is electrically connected to a common voltage source.

The data-driving circuitry 500 may be mounted as integrated-circuits on the first peripheral area PA1 of the thin film transistor array panel 100, instead of being provided on a printed circuit board (PCB). The data-driving circuitry 500 is electrically connected to the data lines $DL_1 \sim DL_m$, which carry the data signals.

The gate-driving circuitry 400 is formed on the second peripheral area PA2 of the thin film transistor array panel 100 and is electrically connected to the gate lines $GL_1 \sim GL_n$, which carry the gate signals.

The sealant 350 is provided in the sealant area SA. The liquid crystal layer 330 is sealed and the two panels 100 and 200 are held in place by the sealant 350. The sealant 350 includes a photosetting material.

The sealant 350 overlaps at least in part the gate-driving circuitry 400. The typical dielectric constant of the sealant 350 is about 4.0, compared with the 10.0 or more dielectric constant of the liquid crystal layer 330. Therefore, parasitic capacitance between the gate-driving circuitry 400 and the counter electrode 270 can be significantly reduced.

As shown in FIG. 2, the counter panel 200 may further include an opaque region 220 or a color filter layer (not shown) between the second substrate 210 and the counter electrode 270. The color filter layer may be formed on the thin film transistor array panel 100.

The liquid crystal layer 330 can be introduced into the space enclosed by the thin film transistor array panel 100, the counter panel 200 and the sealant 350 using a so-called one-drop-filling (ODF) method. In the ODF method, a liquid crystal drop is provided on either the thin film transistor array panel 100, or the counter panel 200, and the sealant 350 is provided on either the thin film transistor array panel 100 or the counter panel 200. The sealant 350 is irradiated by light to be hardened, after alignment with the thin film transistor panel 100 and the counter panel 200 is performed. The light is provided from the side of the thin film transistor array panel 100, so as not to be blocked by the opaque region 220, which would have been the case if the sealant 350 is illuminated from the side of the counter panel 200.

Figure 3:
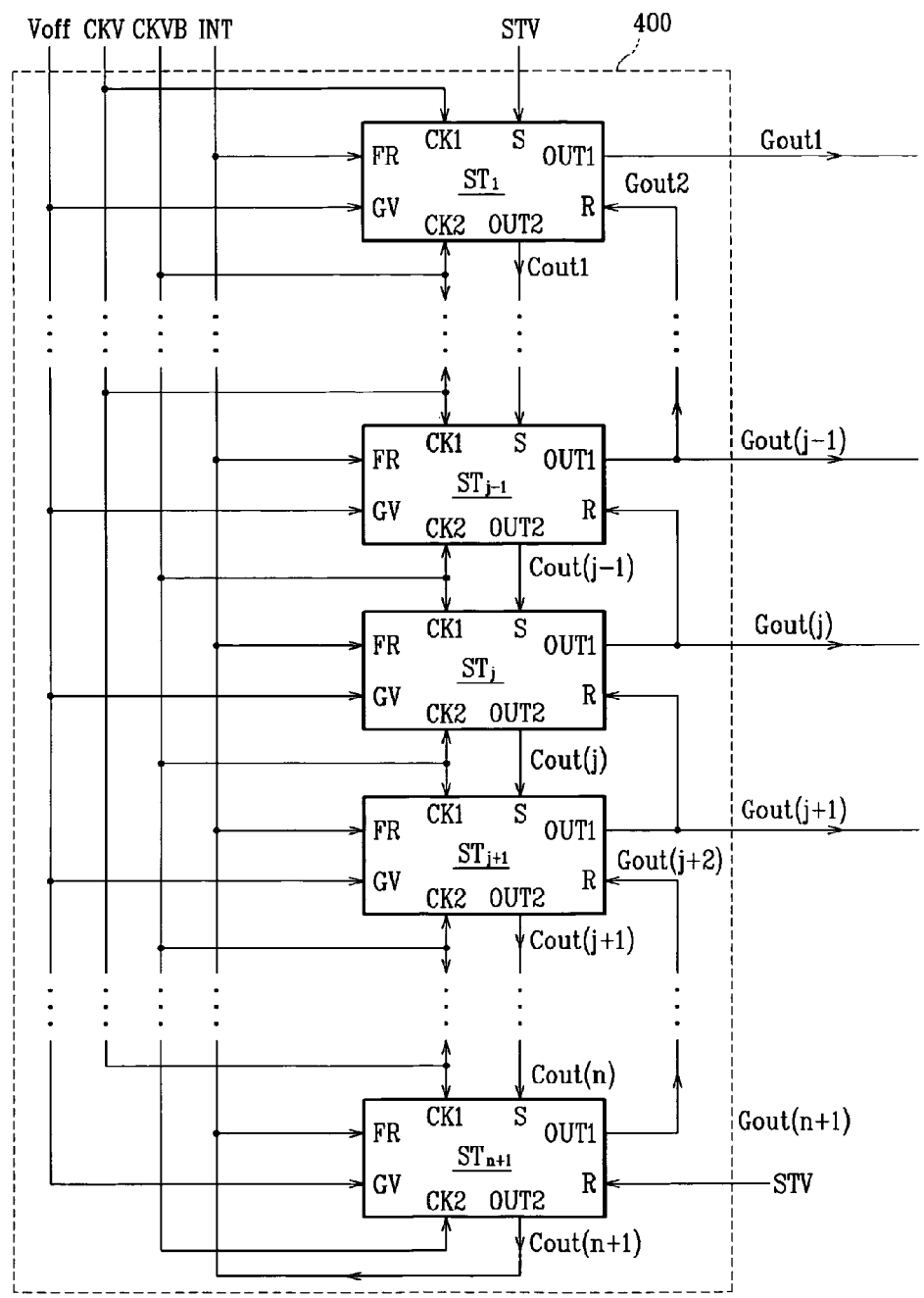
FIG. 3 is an exemplary block diagram of a shift register in the gate-driving circuitry, according to an embodiment of the present invention.
Figure 4:
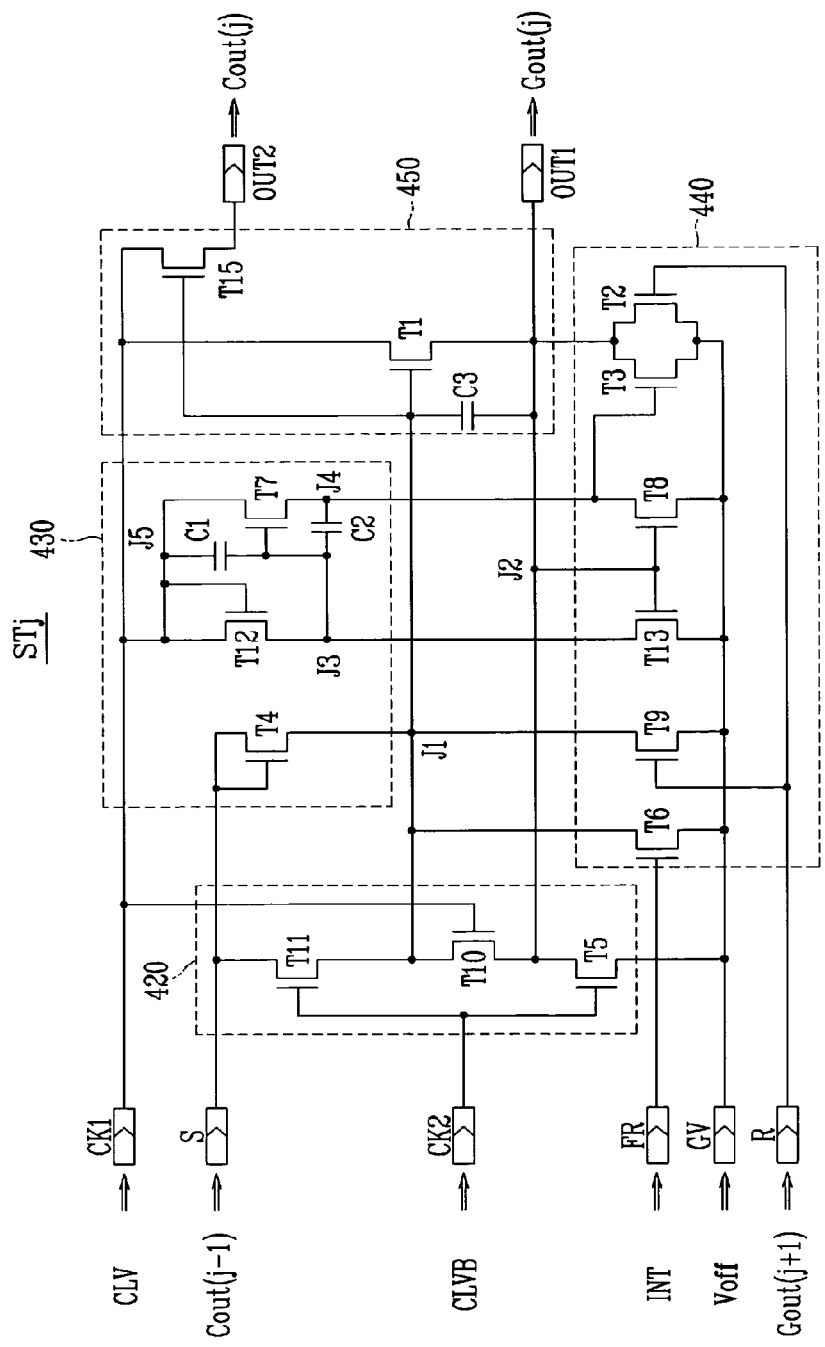
FIG. 4 is an exemplary circuit implementation of a j-th stage of the shift register of FIG. 3.

FIG. 3 is an exemplary block diagram of a shift register of the gate driving portion 400 in accordance with an embodiment of the present invention. FIG. 4 is an exemplary circuit implementation of one stage (e.g., a j-th stage) of the shift register of FIG. 3.

As shown in FIG. 3, the gate-driving circuitry 400 includes n+1 cascaded stages $ST_1 \sim ST_{n+1}$ that are connected to respective gate lines $G_1 \sim G_n$, except for the last stage $ST_{n+1}$. Also, as a shift register, the gate-driving circuitry 400 may receive the gate-off voltage $V_{off}$, first and second clock signals CKV and CKVB, an initialization signal INT and a scan starting signal STV.

Each stage may include a gate voltage terminal GV, first and second clock terminals CK1 and CK2, a set terminal S, a reset terminal R, a frame reset terminal FR, a gate output terminal OUT1, and a carry output terminal OUT2. In each stage (e.g., the j-th stage $ST_j$), the set terminal receives the carry output $C_{out}(j-1)$ of the previous stage $ST_{j-1}$, while the reset terminal R receives the gate output $G_{out}(j+1)$ of the next stage $ST_{j+1}$. Also, the first and second clock terminals CK1 and CK2 receive the complementary first and second clock signals CKV and CKVB, respectively, and the gate voltage terminal GV receives the gate-off voltage $V_{off}$. The stage provides gate output signal $G_{out}(j)$ at gate output terminal OUT1 and a carry output signal $C_{out}(j)$ via the carry output terminal OUT2. (In this embodiment, the first and second clock signals CKV and CKVB have a 50% duty ratio and a 180° phase difference).

The first stage of the shift register (i.e., $ST_1$) receives a scan starting signal STV. Successive stages receiver alternate phases of complementary clock signals CKV and CKVB. That is, if the first and second clock terminals CK1 and CK2 receive the first and second clock signals CKV and CKVB, respectively, in the j-th stage $ST_j$, the first and second clock terminals CK1 and CK2 receive the second and first clock signals CKVB and CKV, respectively.

In order to drive the thin film transistor Tr of the pixel, the high signals of the first and second clock signals CKV and CKVB may be the gate-on voltage $V_{on}$, while the low signals of the first and second clock signals CKV and CKVB may be the gate-off voltage $V_{off}$.

Referring to FIG. 4, the j-th stage $ST_j$ of the gate-driving circuitry 400 includes an input circuit 420, a pull-up driving circuit 430, a pull-down driving circuit 440, and an output circuit 450. The j-th stage $ST_j$ includes transistors T1~T15 (e.g., NMOS transistors), with the pull-up driving circuit 430 and the output circuit 450 further including capacitors C1~C3. Although NMOS transistors are illustrated, PMOS transistors or other types of transistors may be used instead of the NMOS transistors. Also, any of the capacitors C1~C3 can be a parasitic capacitor between the gate and the drain/source terminals of a transistor, formed during manufacturing.

In this embodiment, the input circuit 420 includes a set terminal S and three transistors T5, T10 and T11, connected in series to the gate voltage terminal GV. The gates of the two transistors T5 and T11 are connected to the second clock terminal CK2, and the gate of transistor T10 is connected to the first clock terminal CK1. The junction point between the transistor T11 and the transistor T10 is connected to the junction point J1, and the junction point between the transistor T5 and the transistor T10 is connected to the junction point J2.

As shown in FIG. 4, pull-up driving circuit 430 includes a transistor T4 between the set terminal S and junction point J1, a transistor T12 between the first clock terminal CK1 and the junction point J3, and the transistor T7 between the first clock terminal CK1 and the junction point J4. The gate and the drain of the transistor T4 are commonly connected to the set terminal S, while the source is connected to the junction point J1. Similarly, the gate and the drain of the transistor T12 are commonly connected to the first clock terminal CK1, while the source is connected to the junction point J3.

The gate of the transistor T7 is connected to both the junction point J3 and the first clock terminal CK1. The drain of the transistor T7 is connected to the first clock terminal CK1. The source of the transistor T7 is connected to the junction point J4. The capacitor C2 is located between the junction J3 and the junction J4.

Pull-down driving circuit 440 includes transistors T6, T9, T13, T8, T3, and T2, which have sources for receiving the gate-off voltage $V_{off}$ and drains for transferring the gate-off voltage $V_{off}$ to the junction points J1, J2, J3, and J4. The transistor T9 has a gate connected to the reset terminal R, and a drain connected to the junction point J1. The transistors T13 and T8 have their gates commonly connected to the junction point J2, and their drains connected to the junction points J3 and J4, respectively. The transistors T2 and T3 have gates connected to the junction point J4 and to the reset terminal R, respectively, and a drain, which is commonly connected to the junction point J2. The transistor T6 has a gate connected to the frame reset terminal FR and a drain connected to the junction point J1.

The output circuit 450 may include a capacitor C3 and two transistors T1 and T15. The gates of the transistors T1 and T15 are commonly connected to the junction point J1, while their sources are connected to the first clock terminal CK1. The transistors T1 and T15 have their drains respectively coupled to the output terminals OUT1 and OUT2. The capacitor C3 is between the junction point J1 and J2. The drain of the transistor T1 is also connected to the junction point J2.

Now the operation of the exemplary stage $ST_j$ of FIG. 4 is explained. The high voltage state of a signal is called a "high signal" throughout this specification; the low voltage state of a signal is called a "low signal" and may be substantially the same as the gate-off voltage $V_{off}$.

With the second clock signal CKVB and the previous carry output $C_{out}(j-1)$ both carrying a high signal, the transistors T11, T5, and T4 are turned on. Then, the two transistors T11 and T4 transmit a high signal to the junction point J1, while the transistor T5 transmits a low signal to the junction point J2. Thereafter, the transistors T1 and T15 are turned on and the first clock signal CKV is transmitted to the output terminals OUT1 and OUT2.

Because the signal of the junction point J2 and the first clock signal CKV are low signals, the output signals $G_{out}(j)$ and $C_{out}(j)$ are low signals; simultaneously, the capacitor C3 is charged to the voltage difference between the high signal and the low signal.

At this time, because the signal clock CKV, the next gate output $G_{out}(j+1)$ and the junction point J2 are all low signals, the connected transistors T10, T9, T12, T13, T8, and T2 all turn off.

Subsequently, the transistors T11 and T5 turn off when the second clock signal CKVB is low; simultaneously, the output signal of the transistor T1 and the signal of the junction point J2 are high signals when the first clock signal CKV is a high signal. At this time, because the gate and the source of the transistor T10 have high signals, the zero voltage difference turns off the transistor T10. Accordingly, the high signal of the capacitor C3 is added to the floating junction point J1.

The high signal of the first clock signal CKV and the junction point J2 turn on the transistors T12, T13 and T8. The directly connected transistors T12 and T13 are in voltages between the high signal and the low signal and determine the divided potential of the junction point J3 according to the resistance of the turned on transistors T12 and T13.

Here, if the resistance of the transistor T13 in its turn-on state is greater than that of the transistor T12 in its turn-on state (e.g., 10,000 times greater), the voltage of the junction point J3 is substantially the same as the high signal. Subsequently, the transistor T7 is turned on, and the voltage of the junction point J4 is determined by the turn-on resistance of the transistors T7 and T8.

With the transistors T7 and T8 having substantially the same resistance, the junction point J4 has a voltage intermediate between the high signal and the low signal; thus, the transistor T3 remains turned off. Also, the transistors T9 and T2 remain turned off because the next gate output $G_{out}(j+1)$ stays at low signal.

Accordingly, the output terminals OUT1 and OUT2 transmit high signals by being isolated from a low signal and being connected to the first clock signal CKV. The capacitors C1 and C2 are charged by the respective potential difference of their terminals, and the potential of the junction point J3 is lower than the potential of the junction point J5.

When the next gate output signal $G_{out}(j+1)$ and the second clock signal CKVB have high signals and the first clock signal CKV has a low signal, the transistors T9 and T2 are turned on and transmit low signals to the junction points J1 and J2. The voltage of the junction point J1 is lowered by discharging the capacitor C3 to the low voltage.

Accordingly, the two transistors T1 and T15 remain turned on for a time period after the next gate output $G_{out}(j+1)$ has a high signal; then, the output terminals OUT1 and OUT2 transmit low signals, being connected to the first clock signal CKV.

Next, the carry output $C_{out}(j)$ is floating and remains a low signal because the output terminal OUT2 is isolated from the first clock signal CKV by turning off the transistor T15, which results from the complete discharge of the capacitor C3 and the low voltage of the junction point J1. Simultaneously, even when the transistor T1 is turned off, the output terminal OUT1 continuously transmits a low voltage because of the connection with the low signal via transistor T2.

The junction point J3 is isolated because the transistors T12 and T13 are turned off. Also, the voltage of the junction point J5 is lower than that of the junction point J4, and the transistor T7 is turned off because the voltage of the junction point J3 remains lower than that of the junction point J5 by the voltage on capacitor C1. Simultaneously, due to the transistor T8 being turned off, the voltage of the junction point J4 is lowered. Also, the transistor T10 remains turned off because its gate is connected to the low voltage of the first clock signal CKV and the signal of the junction point J2 is low. Next, with the first clock signal CKV being high, the transistors T12 and T7 are turned on, and with the voltage of the junction point J4 increasing, the transistor T3 is turned on and transmits a low signal to the junction point J2 to make the output terminal OUT1 transmit the low signal. That is, even though the output of the next gate output $G_{out}(j+1)$ has a low signal, the voltage of the junction point J2 may be a low signal.

Having the gate connected to the high first clock signal CKV and low signal junction point J2, the transistor T10 is turned on and transmits the low voltage of the junction point J2 to the junction point J1. The sources of the transistors T1 and T15 receive the first clock signal CKV continuously because the sources are connected to the first clock terminal CK1. Furthermore, because the transistor T1 is larger than the other transistors, the change of the source voltage can affect the gate voltage because of the large parasitic capacitance between the gate and the source in transistor T1.

Therefore, with the high clock signal CKV, the transistor T1 can be turned on due to the parasitic capacitance between its gate and its source. To prevent switching on the transistor T1, the gate signal of the transistor T1 is maintained as a low signal by transmitting the low signal of the junction point J2 to the junction point J1.

Later on, until the previous carry output $C_{out}(j-1)$ attains a high voltage, the junction point J1 maintains the low signal. The junction point J2 maintains a low voltage via the transistor T3 when the first clock signal CKV is a high voltage and the second clock signal CKVB is a low voltage; otherwise, with low first clock signal CKV and high second clock signal CKVB, the junction point J2 maintains a low voltage via the transistor T5.

Receiving an initialization signal INT from the carry output $C_{out}(n+1)$ of the last dummy stage $ST_{n+1}$, the transistor T6 transmits the gate-off signal $V_{off}$ to the junction point J1.

As explained above, the j-th stage $ST_j$ generates the carry signal $C_{out}(j)$ and the gate signal $G_{out}(j)$ based on the previous carry signal $C_{out}(j-1)$, the next gate signal $G_{out}(j+1)$, the first and second clock signals CKV and CKVB.

Figure 5:
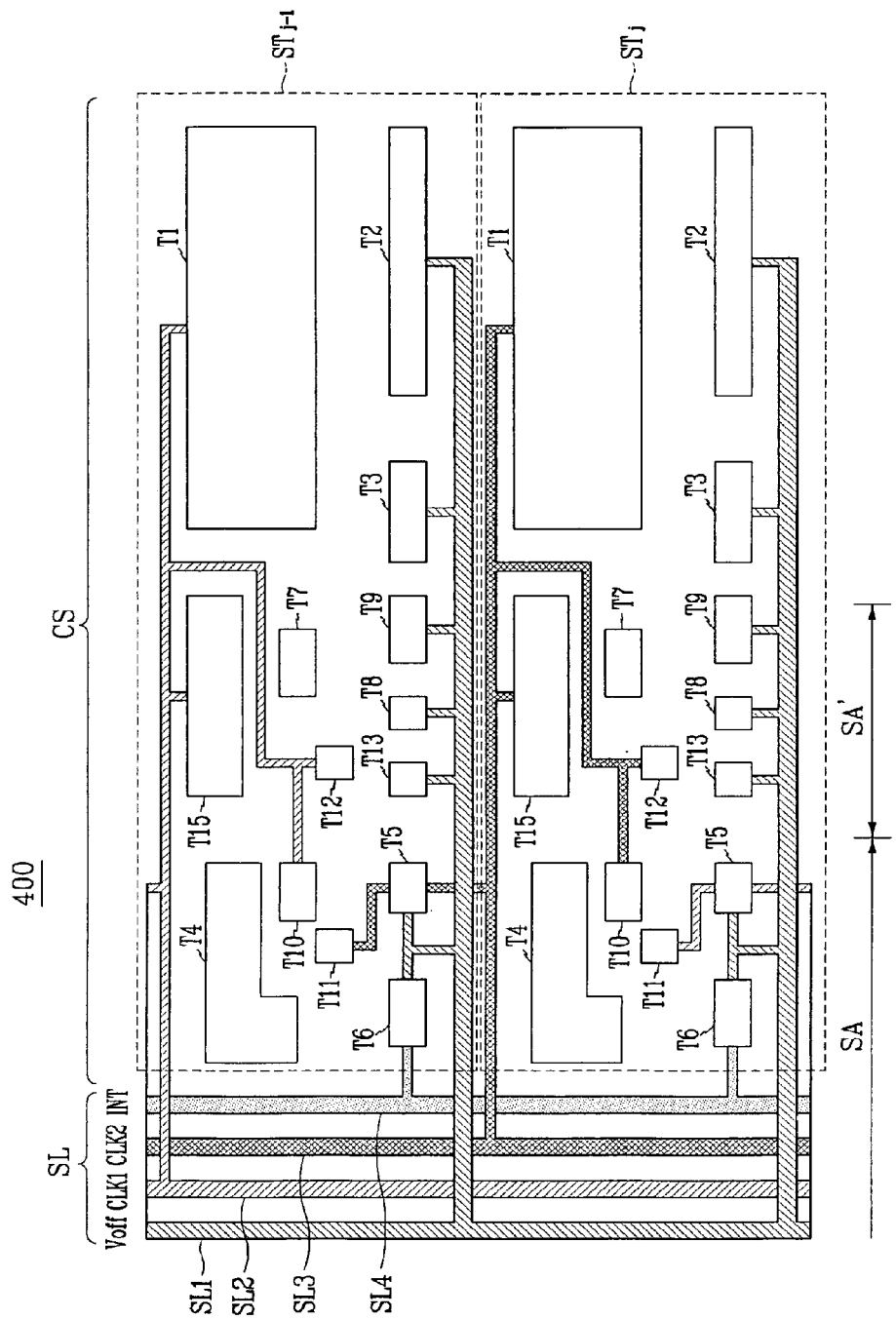
FIG. 5 is an exemplary layout view of the gate-driving circuitry in accordance with an embodiment of the present invention.
Figure 6:
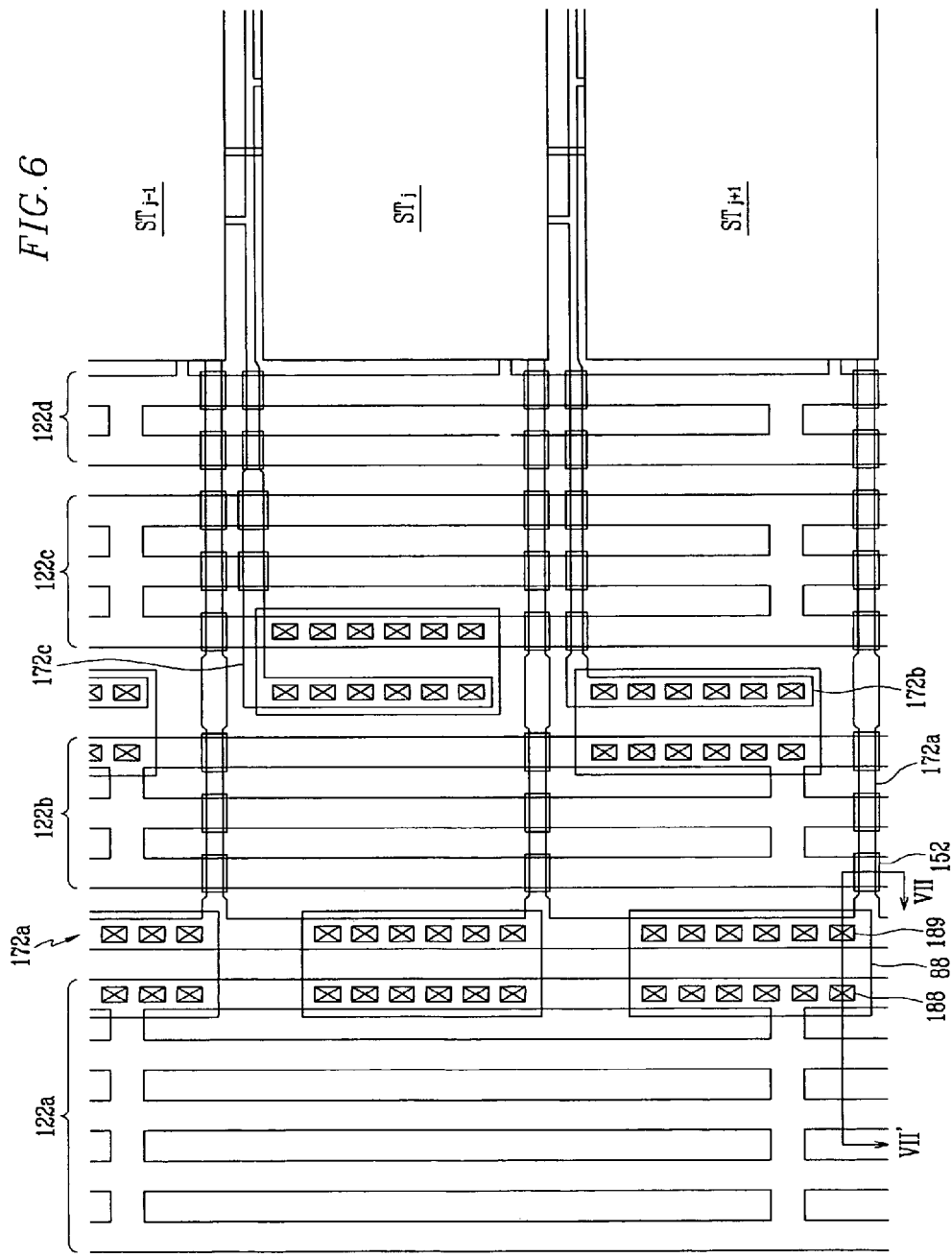
FIG. 6 is an exemplary layout view of the signal lines of the gate-driving circuitry of FIG. 5.
Figure 8:
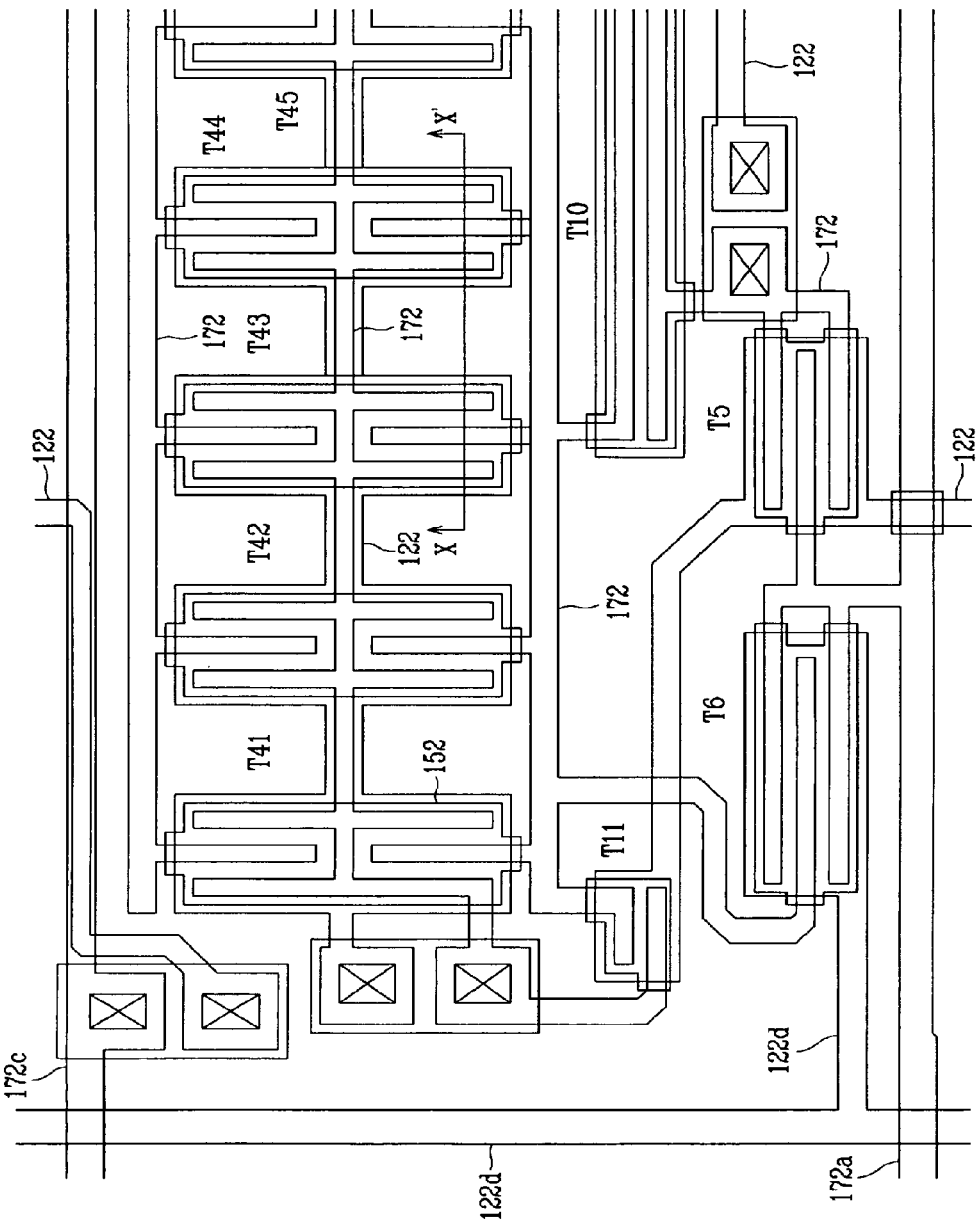
FIG. 8 is an exemplary layout view of the driving circuitry of the gate-driving circuitry of FIG. 5.

An exemplary implementation of the gate-driving circuitry 400 is now explained in reference to FIGS. 5, 6 and 8. FIG. 5 is an exemplary layout view of the gate-driving circuitry in accordance with an embodiment of the present invention. FIG. 6 is an exemplary layout view of signal lines of the gate driving portion of FIG. 5. FIG. 8 is an exemplary layout view of a driving circuitry of the gate-driving circuitry of FIG. 5.

As shown in FIG. 5, the gate-driving circuitry 400 in accordance with an embodiment of the present invention includes a driving circuitry CS having cascaded stages $ST_1 \sim ST_{n+1}$, and a set of signal lines SL transmitting various signals, for example, $V_{off}$, CKV, CKVB and INT to cascaded stages $ST_1 \sim ST_{n+1}$.

The set of signal lines may include a gate-off signal line SL1 transmitting the gate-off signal $V_{off}$, first and second clock signal lines SL2 and SL3 transmitting first and second clock signals CKV and CKVB, respectively, and an initialization signal line SL4 transmitting the initialization signal INT. The signal lines SL1 SL4 extend vertically. The gate-driving circuitry 400 may further include bridge lines 172 (172a~172c as in FIG. 6) extending horizontally to the stages $ST_1 \sim ST_{n+1}$.

In each stage, for example the (j−1)-th stage $ST_{j-1}$, of the driving circuitry CS, the transistor T4 receiving the previous carry output $C_{out}(j-2)$ may be located near the previous stage $ST_{j-2}$, and the transistors T1 and T15 receiving the first clock signal CKV from the first clock signal line SL2 may be located along the bridge line connected to the first clock signal line SL2. The transistors T7, T10 and T12 which also receive the first clock signal CKV are located near the bridge line connected to the first clock signal line SL2. The transistors T11 and T5 receiving the second clock signal CKVB from the second signal line SL3 may be located along the bridge line connected to the second signal line SL3, and the transistor T6 receiving the initialization signal INT from the initialization signal line SL4 may be located leftmost. The transistors T2, T3, T8, T9 and T13 receiving the gate-off signal $V_{off}$ from the gate-off signal line SL1 are located along the bridge line connected to the gate-off signal line SL1.

The layout of the transistors in the j-th stage $ST_j$ is the same as in the above (j−1)-th stage $ST_{j-1}$, except that the first clock signal CKV and the first clock signal line SL2 are interchanged with the second clock signal CKVB and the second clock signal line SL3, respectively.

Signal lines SL and part of the driving circuitry CS are located in the sealant area SA, while the remaining part of the driving circuitry CS is located in a manufacturing marginal area SA' of the seal area SA. The width of the manufacturing marginal area SA' is currently about 0.3 mm, which is the maximum deviation from the target in disposing the sealant 350 on the seal area SA.

As explained above, the signal lines and the transistors in the seal area SA or the manufacturing marginal area SA' should be designed to allow sufficient light (Lg) from the first substrate 110 to pass through to harden the sealant 350.

As shown in FIG. 6, the wide signal lines such as SL1~SL3 have a ladder or net-shaped structures 122a-122c each having apertures through which light can easily pass. Accordingly, each signal line SL1~SL3 may include a first group of branches extending vertically, a second group of branches between and connecting the branches of the first group, and apertures enclosed by the first and second groups of branches. Each branch or each aperture may be provided a predetermined width to allow light to easily pass through (e.g., about 20~30 μm, and preferably about 25 μm). The total width of each of signal lines SL1~SL3 may be determined from the increased resistance resulting from the apertures formed in it. For a signal line that is more than 100 µm wide, the structure described above has significant advantages.

As shown in FIG. 8, a large transistor located in the sealant area SA or in the manufacturing marginal area SA' (e.g., the transistor T4 or T15 of the FIG. 5) includes smaller transistors connected in parallel and spaced apart from one another by apertures. The width of each smaller transistor or each aperture is provided such as to allow light to easily pass through (e.g., 100 µm or less).

Figure 7:
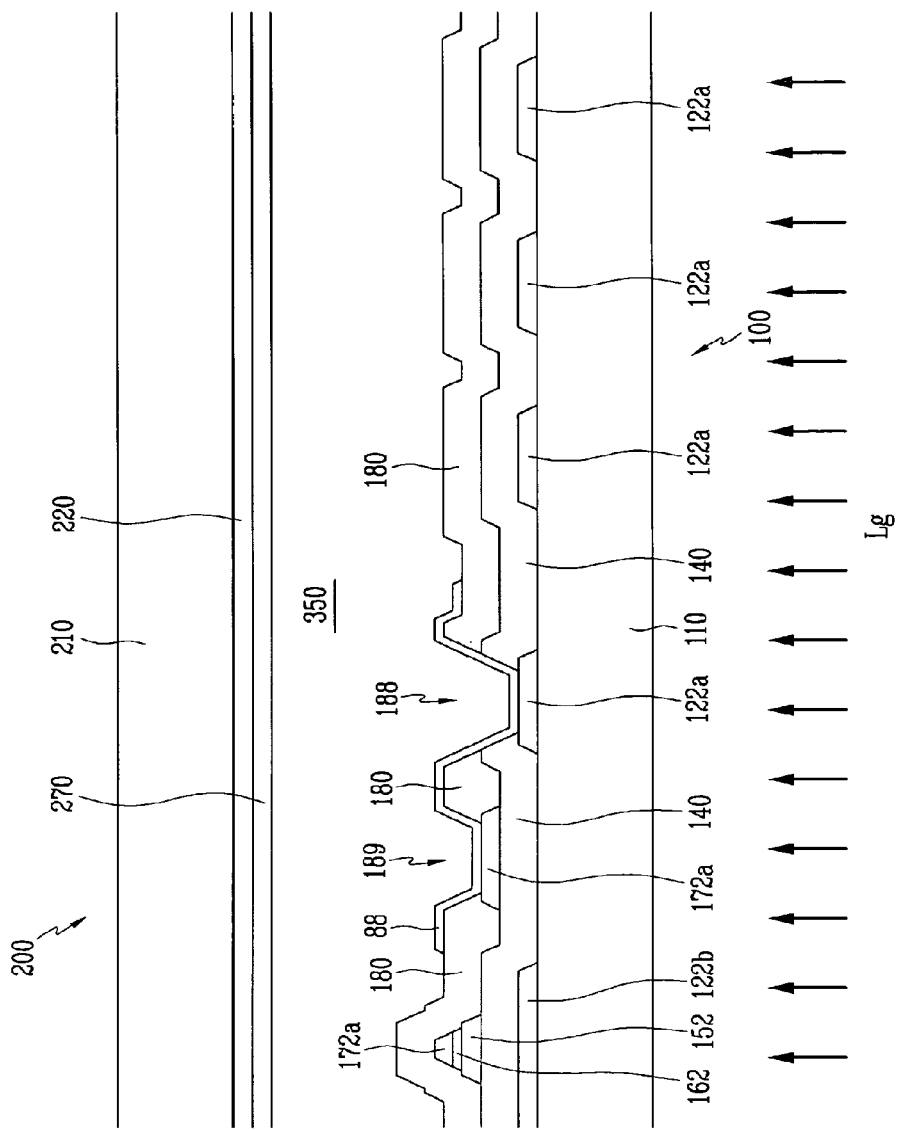
FIG. 7 is a cross-sectional view taken along the line VII-VII' of FIG. 6.
Figure 9:
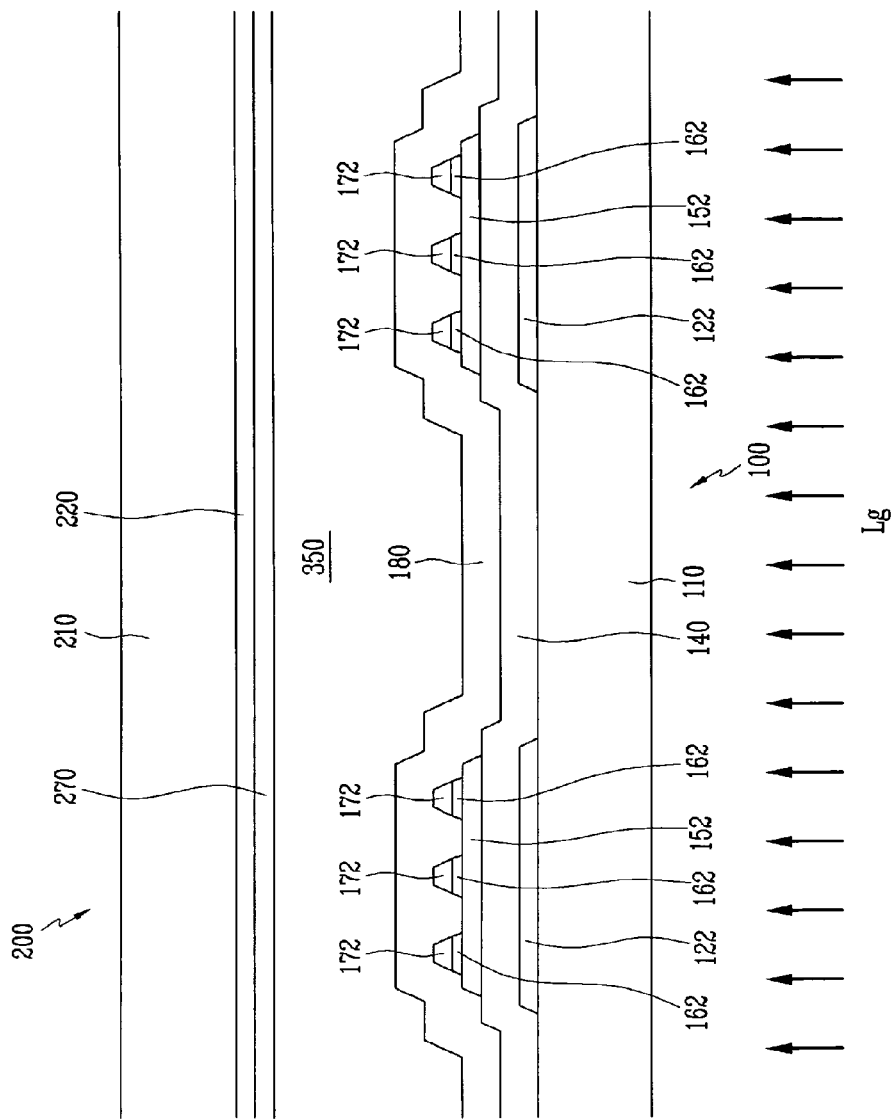
FIG. 9 is a cross-sectional view taken along the line IX-IX' of FIG. 8.
Figure 10:
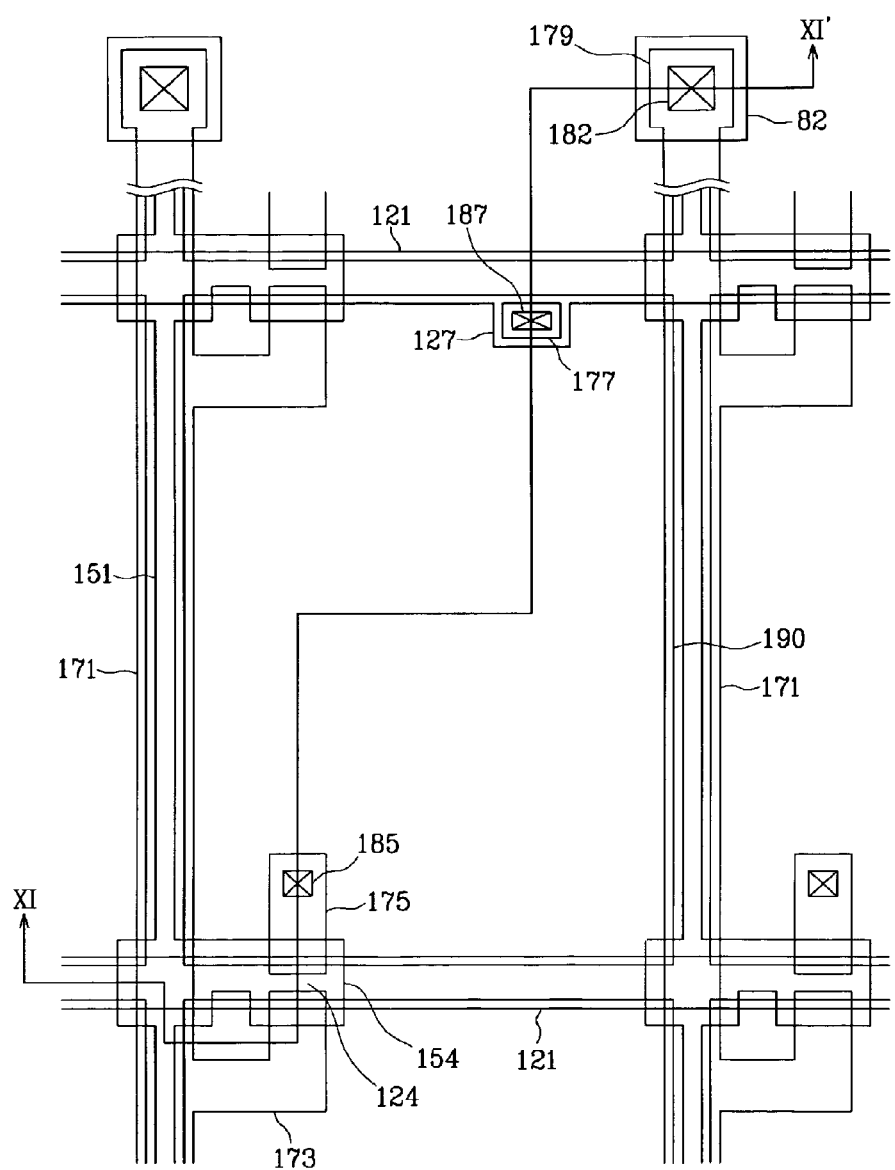
FIG. 10 is an exemplary layout view of a pixel in a display area.
Figure 11:
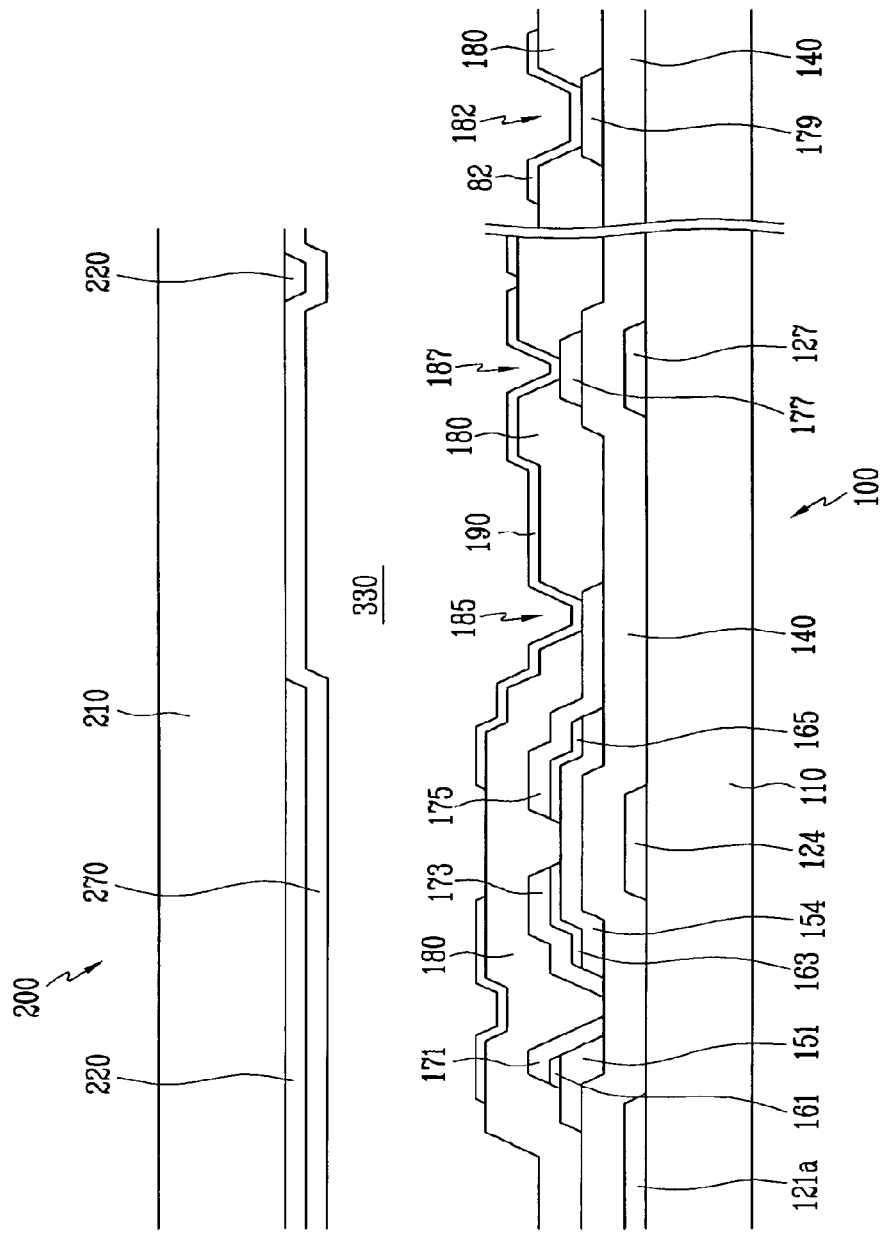
FIG. 11 is a cross-sectional view taken along the line XI-XI' of FIG. 10.

The structure of the thin film transistor array panel 100 including the gate-driving circuitry 400 is now explained in reference to FIGS. 7 and 9-11 as well as FIGS. 6 and 8. FIG. 7 is a cross-sectional view taken along the line VII-VII' of FIG. 6. FIG. 9 is a cross-sectional view taken along the line IX-IX' of FIG. 8. FIG. 10 is an exemplary layout view of a pixel in a display area. FIG. 11 is a cross-sectional view taken along the line XI-XI' of FIG. 10.

Gate lines 121 and signal lines 122(122a~122d) of the gate-driving circuitry 400 are formed on the insulating substrate 110.

As shown in FIG. 10, the gate lines 121 extend horizontally to the gate-driving circuitry 400 and transmit the gate signals. Each of gate line 121 may include a gate electrode 124, and, in another portion, may be projections 127.

As shown in FIG. 6, the signal lines 122a~122d extend vertically and transmit the gate-off signal $V_{off}$, the first and the second clock signals CKV and CKVB, and the initialization signal INT. Except for the narrowest one 122d, the signal lines 122a~122c have ladder or net-shaped structures including long vertical branches, short horizontal branches between and connecting adjacent vertical branches, and apertures enclosed by the vertical and horizontal branches. Each branch or each aperture may have a predetermined width so that light can easily pass through, (e.g., about 20~30 µm, and preferably about 25 µm). The total width of each signal line 122a~122c may be determined from the increased resistance introduced by apertures formed in it. Such a structure is desirable for a signal line of more than 100 µm wide.

As shown in FIG. 8, the signal lines 122 are electrically connected to the gates of the transistors of the driving circuitry.

The gate lines 121 and the signal lines 122 are formed out of a low resistivity conductive layer (e.g., silver, a silver alloy, aluminum, an aluminum alloy, copper or a copper alloy). Additionally, the gate lines 121 and the signal lines 122 may have a multi-layered structure including an additional conductive layer, such as chrome, titanium, tantalum, molybdenum, or their alloys (e.g., MoW alloy), which have good chemical, physical and electrical contact properties with indium tin oxide (ITO) or indium zinc oxide (IZO). One example of the multi-layered structure for the gate lines 121 is Cr/Al—Nd alloy. The gate lines 121 and the signal lines 122 may be tapered about 30~80° to the surface of the insulating substrate 110.

A gate insulating layer 140, made of SiNx, for example, covers the gate lines 121 and the signal lines 122. Linear semiconductors 151 or island type semiconductors 152 made of, for example, hydrogenated amorphous silicon, are formed on the gate insulating layer 140. The linear semiconductor 151 extends vertically and has extension portions 154 toward the gate electrode 124. Also, the linear semiconductor 151 widens near the crossing point with gate line 121 to cover the wide area of gate line 121. As shown in FIG. 8, the island type semiconductor 152 is located on the gate electrode.

On the semiconductor layer 151 and 152, a linear or island type silicide or highly doped n+ hydrogenated amorphous silicon may be formed as ohmic contacts 161, 162 and 165. The linear ohmic contact 161 includes the second protrusion 163, which is located on the first extension portion 154 of the linear semiconductor 151 in conjunction with the island type ohmic contact 165. The other island type ohmic contacts 162 are located on the island type semiconductor 152. The ohmic contacts 161, 162 and 162 or the semiconductor 151 and 152 may be tapered about 30~80° relative to the surface of the substrate 110.

Data lines 171, output electrodes 175, storage capacitor conductors 177, and a bridge lines 172 (172a~172c) are formed on the ohmic contacts 161, 162 and 165, and the gate insulating layer 140. As shown in FIG. 10, the data lines 171 extend vertically, crossing with the gate lines 121, and transmit the data signals (e.g., data voltages). Branches, extended from each data line 171 to the output electrodes 175, forms the input electrodes 173. The input and output electrodes 173 and 175 in pair are separated and face each other across the gate electrode 124.

The storage capacitor conductor 177 overlaps the projection 127 of the gate line 121.

As shown in FIG. 6, the bridge line 172a may be formed between the gate-off signal line 122a and the first clock signal line 122b, and may include a vertical branch and horizontal branches extending to each stage. The bridge lines 172b and 172c may be formed between the first clock signal line 122b and the second clock signal line 122c, and may include a vertical branch and a horizontal branch extending to each stage.

The data lines 171, the output electrodes 175, the bridge lines 172 and the storage capacitor conductors 177 are made of, for example, a low resistivity conductive layer of silver, a silver alloy, aluminum, an aluminum alloy, copper or a copper alloy. Additionally, the data lines 171, the output electrodes 175 and the storage capacitor conductors 177 may have a multi-layered structure including an additional conductive layer of, for example, a refractory metal, such as molybdenum, chrome, titanium, tantalum, or their alloys (e.g. MoW ally).

The lateral sides of the data line 171, the output electrode 175, the bridge lines 172 or the storage capacitor conductor 177 are tapered about 30~80° to the surface of the substrate 110. Linear or island type ohmic contacts 161, 162 and 165 are provided between the lower semiconductor 151 and 152 and the upper data lines 171, the output electrode 175 or the bridge line 172 for reducing contact resistance.

On the data lines 171, the output electrodes 175, the bridge lines 172, the storage capacitor conductor 177, and exposed semiconductor 151, a passivation layer 180 can be made of, for example, an easily flattened and photosensitive organic material, a low dielectric (e.g., less than 4.0), insulating material such as a-Si:C:O or a-Si:O:F formed by plasma enhanced chemical vapor deposition (PECVD), or an inorganic material such as SiNx. The passivation layer 180 also may have a multi-layered structure including organic and inorganic layers.

On the passivation layer 180, contact holes 182, 185, 187 and 188 are formed to partially expose the area of the end portion 179 of the data lines 171, the output electrode 175, the storage capacitor conductor 177, and the bridge line 172.

On the passivation layer 180, an ITO or IZO layer of pixel electrodes 190, contact assistants 82 and connection assistants 88 are formed. Through the contact holes 185 and 187, the pixel electrodes 190 are connected to the output electrode 175 for receiving the data voltage, and connected to the storage capacitor conductor 177 for transmitting the data voltage.

Liquid crystal molecules of the liquid crystal layer 330 are rearranged according to the electric field generated by the data voltage applied to the pixel electrode 190 and the common voltage applied to the counter electrode. Also, as explained above, the voltage difference between the pixel electrode 190 and the counter electrode 270 remains after the corresponding thin film transistor turns off. To increase the capacitance, an additional capacitor, called the storage capacitor $C_{ST}$, may be provided in a parallel connection to the liquid crystal capacitor.

The storage capacitor $C_{ST}$ can be made by overlapping the pixel electrode 190 with its neighboring gate line. To enhance the storage capacitance, the gate line 121 can include extensional portion 127 for a wider overlapped area, and furthermore, the storage capacitor conductor 177, connected to the pixel electrode and overlapped with the extensional portion 127, may be located under the passivation layer 180. Also, the pixel electrode 190 can be overlapped with the neighboring gate lines or data lines for a higher aperture ratio.

The contact assistant 82, which is optional, may be connected to the data lines end portion 179 via contact hole 182 to enhance a contact property with an external device and to protect the data lines end portion 179. The auxiliary electrodes 88 may be connected to the signal lines 122 and the bridge lines 172 via contact holes 188 and 189, respectively. Auxiliary electrode 88 need not be divided into smaller parts if the auxiliary electrode 88 is made of a transparent conductive metal through which light can easily pass. Moreover, the contact resistance decreases according to the size of the auxiliary electrode 88.

According to one or more embodiments of the present invention, transparent conductive polymer material can be used as the pixel electrode 190. Alternatively, for reflective LCD, opaque reflective metal also can be used as the pixel electrode 190. The contact assistant 82 can be made of a different material from the pixel electrode 190 such as ITO and/or IZO.

According to one or more embodiments of the present invention, the signal lines 122 (122a~122d) may be formed of the same layer as the data lines 171, and the bridge lines 172 (172a~172c) may be formed of the same layer as the gate lines 121.

Embodiments described above illustrate but do not limit the invention. Numerous modifications and variations are possible within the scope of the present invention. Accordingly, the scope of the invention is defined only by the following claims.

The invention claimed is:

1. A display device comprising:
   an insulating substrate comprising a display area;
   at least one gate line on the insulating substrate;
   at least one data line insulated from the gate line;
   at least one first switching element connected to the gate line and the data line;
   a plurality of signal lines disposed in outside the display area; and
   an insulator on the insulating substrate,
   wherein the signal lines comprise a first signal line comprising at least one aperture,
   wherein the first signal line comprises portions overlapping the insulator,
   wherein the portions of first signal line enclose the aperture, are electrically connected to one another, and are configured to transmit a same signal, and
   wherein the aperture overlaps the insulator.

2. The display device of claim 1, wherein the first signal line is ladder- or net-shaped.

3. The display device of claim 1, wherein the portions of the first signal line comprise a first group of branches and a second group of branches electrically connected to one another, and wherein the aperture of the first signal line is enclosed by the first group of branches and the second group of branches.

4. The display device of claim 3, wherein a width of each branch of the first and second groups of branches is between about 20 μm and about 30 μm.

5. The display device of claim 3, wherein branches of the second group of branches are between branches of the first group of branches and connect the branches of the first group of branches.

6. The display device of claim 1, wherein a width of the at least one aperture of the first signal line is between about 20 μm and about 30 μm.

7. The display device of claim 1, further comprising at least one gate driving circuit disposed on the insulating substrate,
   wherein the at least one gate driving circuit comprises a driving circuitry comprising at least one stage for outputting a gate signal to the gate line and the signal lines, and
   wherein the signal lines electrically connected to the driving circuitry.

8. The display device of claim 7, wherein the first signal line is disposed farther from the driving circuitry than any of the other signal lines.

9. The display device of claim 8, wherein the plurality of signal lines further comprises a second signal line not having an aperture.

10. The display device of claim 9, wherein the first signal line is configured to provide the driving circuitry with a gate off signal,
    wherein the second signal line is configured to provide the driving circuitry with an initialization signal.

11. The display device of claim 9, wherein the second signal line is disposed between the first signal line and the driving circuitry.

12. The display device of claim 9, wherein the plurality of signal lines further comprises third and fourth signal lines disposed between the first and second signal lines, each of the third and fourth comprising at least one aperture.

13. The display device of claim 12, wherein the third and fourth signal lines are configured to provide the driving circuitry with a first clock signal and a second clock signal, respectively, where the first clock signal has a phase different from that of the second clock signal.

14. The display device of claim 9, a width of the second signal line is less than about 100 μm.

15. The display device of claim 7, wherein the stage comprises a second switching element comprising the same layers as the first switching element.

16. A display device comprising:
    an insulating substrate comprising a display area;
    at least one gate line on the insulating substrate;
    at least one data line insulated from the gate line;
    at least one first switching element connected to the gate line and the data line;
    a plurality of signal lines disposed in outside the display area;

a second switching element disposed in outside the display area; and an insulator on the insulating substrate, wherein the plurality of signal lines comprises a first signal line comprising at least one aperture, wherein the aperture exposes the insulator, wherein the second switching element comprises the same layers as the first switching element and at least two sub-switching elements, wherein the two sub-switching elements are connected to each other in parallel and spaced apart from each other.

17. The display device of claim 16, wherein a space between the two sub-switch elements is less than about 10 µm.

18. The display device of claim 17, wherein the space overlaps the insulator.

19. The display device of claim 16, further comprising at least one gate driving circuit disposed on the insulating substrate, wherein the at least one gate driving circuit comprises a driving circuitry comprising at least one stage for outputting a gate signal to the gate line and the signal lines, and wherein the signal lines electrically connected to the driving circuitry.

20. The display device of claim 19, wherein the stage comprises the second switching element and is positioned between the aperture and the gate line.

* * * * *